(12) United States Patent
Hofmann

(10) Patent No.: US 7,129,791 B2
(45) Date of Patent: Oct. 31, 2006

(54) CIRCUIT AND METHOD FOR FASTER FREQUENCY SWITCHING IN A PHASE LOCKED LOOP

(75) Inventor: Karl Hofmann, Ulm (DE)

(73) Assignee: ATMEL Germany GmbH, Heilbronn (DE)

( * ) Notice: Subject to any disclaimer, the term of this patent is extended or adjusted under 35 U.S.C. 154(b) by 44 days.

(21) Appl. No.: 10/912,529

(22) Filed: Aug. 4, 2004

(65) Prior Publication Data

US 2005/0046493 A1 Mar. 3, 2005

(30) Foreign Application Priority Data

Aug. 4, 2003 (DE) ............................ 103 36 297

(51) Int. Cl.
*H03L 7/00* (2006.01)
(52) U.S. Cl. .................. 331/16; 331/17; 331/177 R; 331/34; 331/175
(58) Field of Classification Search ............ 331/1 A, 331/17, 16, 179, 177 R, 34, 175
See application file for complete search history.

(56) References Cited

U.S. PATENT DOCUMENTS

| | | | | |
|---|---|---|---|---|
| 4,562,410 | A | 12/1985 | O'Rourke | 331/1 A |
| 5,334,952 | A * | 8/1994 | Maddy et al. | 331/1 A |
| 5,357,215 | A | 10/1994 | Greiderer | 331/16 |
| 5,389,899 | A | 2/1995 | Yahagi et al. | 331/10 |
| 5,420,545 | A | 5/1995 | Davis et al. | 331/18 |
| 5,656,975 | A | 8/1997 | Imura | 331/11 |
| 6,621,356 | B1 * | 9/2003 | Gotz et al. | 331/25 |
| 6,717,475 | B1 * | 4/2004 | McCarthy | 331/17 |
| 2002/0153959 | A1 * | 10/2002 | Gotz et al. | 331/1 A |

FOREIGN PATENT DOCUMENTS

| | | |
|---|---|---|
| DE | 42 16 714 | 12/1993 |
| EP | 0 582 390 | 2/1994 |
| EP | 0 993 122 | 4/2000 |
| WO | WO 95/13666 | 5/1995 |

* cited by examiner

*Primary Examiner*—Arnold Kinkead
(74) *Attorney, Agent, or Firm*—W. F. Fasse; W. G. Fasse

(57) ABSTRACT

A PLL circuit arrangement includes a first frequency divider connected to a reference frequency source, a second frequency divider connected to the output of an oscillator controlled by the output of a loop filter, a phase/frequency detector that detects phase/frequency differences between the two divider outputs, a charge pump between the detector and the loop filter, a controller providing a changeable divider ratio to the first and/or second frequency divider, and a regulating signal generator that changes the output voltage of the loop filter applied to the oscillator in a controlled manner in response to a change of the divider ratio. The signal generator preferably has inputs connected to outputs of the controller and the frequency dividers, and an output connected to the charge pump and/or the loop filter to accelerate the recharging thereof in response to a change of the divider ratio.

36 Claims, 2 Drawing Sheets

CIRCUIT AND METHOD FOR FASTER FREQUENCY SWITCHING IN A PHASE LOCKED LOOP

PRIORITY CLAIM

This application is based on and claims the priority under 35 U.S.C. §119 of German Patent Application 103 36 297.5, filed on Aug. 4, 2003, the entire disclosure of which is incorporated herein by reference.

FIELD OF THE INVENTION

The invention relates to a circuit arrangement and a method for generating frequencies with a phase regulating circuit, and particularly a phase locked loop including at least one frequency divider, a charge pump, a loop filter, and an oscillator arranged downstream of and controlled by the output of the loop filter.

BACKGROUND INFORMATION

The circuit and method of the above mentioned general type forming the field of this invention are known from the published European Patent application EP 0 993 122 A1. To generate a control voltage for controlling the voltage controlled oscillator (VCO), this European publication provides an adder circuit, which adds a predetermined frequency-dependent voltage to the output voltage of the loop filter. Those measures aim to reduce the transient settling time or frequency pull-in time of the circuit in connection with a change of the frequency.

Phase regulating circuits, and particularly phase locked loops (PLLs) are utilized, for example, to generate defined signals with frequency synthesizers for mixers. For this purpose in transceiver systems, it is necessary that the rated or nominal frequency of the PLL output signal can be sharply varied within a short time. Thus, for example, in the context of the GPRS (Global Packet Radio Services) standard, it is required that a frequency jump of about 150 MHz at an average or mid-frequency of about 2 to 2.4 GHz is carried out within about 150 to 200 μs. This time in which the frequency is switched to a new frequency (allowing for a transient to settle out to the new frequency) is referred to as the settling time. The accuracy with which the new nominal selected or desired frequency must be established within this settling time amounts to a few kHz.

The basic function of a phase regulating circuit and particularly a phase locked loop (PLL) involves dividing a reference frequency of, for example, 13 MHz by a factor R (typically 65) in a frequency divider. As a result, a frequency of about 200 kHz will be established at the output of the frequency divider. In the assumed example case of a GSM application, this frequency defines the channel raster prescribed by the system. Moreover, a second signal FVCO is generated by a voltage controlled oscillator (VCO) at a frequency of about 2 GHz. This second frequency signal is divided by a divisor N in a second frequency divider. By means of the regulating loop of the PLL including the charge pump and the loop filter, the flank of the divided signal of the VCO is regulated in such a manner so that the two input signals of the PLL have the same frequency and a fixed phase relationship. The two frequency dividers can be programmed via a serial interface, so that the frequency of the VCO can be adjusted, for example in 200 kHz steps, through an adjustment or variation of the divisor N by which the output signal of the VCO is divided.

With a comparison frequency of 200 kHz, a respective comparison is carried out every 5 μs. The loop filter must ensure that this 200 kHz interference only leads to a small or minor modulation of the voltage at the input of the voltage controlled oscillator (VCO). If this is not the case, spurious signals at a spacing of 200 kHz from the carrier frequency arise in the output spectrum of the VCO. It is typically required that these spurious signals are damped at greater than 60 dBc (decibels below carrier). The result thereof is that the bandwidth of the loop filter is normally limited to about 10 to 15% of the comparison frequency. For GSM applications, this means that the bandwidth is limited to about 20 to 30 kHz.

Simultaneously with limiting the bandwidth, the above damping of spurious signals also determines the settling time that is determinative of the transient frequency settling or pull-in of the PLL after a programmed frequency change. For frequency changes in the range from 100 MHz to 150 MHz, this means that a transient frequency settling or pull-in cannot be achieved within 200 μs if the bandwidth of the loop filter is about 20 kHz. This problem cannot be solved by increasing the filter bandwidth, because then the spurious signals can no longer be adequately and reliably suppressed.

In this context it is known to use a fractional PLL instead of an integer or integral PLL. However, a concept, e.g. a circuit arrangement and a method, with a fractional PLL requires special circuit measures for compensating so-called "fractional spurs". In order to be able to further utilize the relatively simple concept of an integer PLL rather than a fractional PLL, National Semiconductor developed a so-called "FASTLOCK" architecture (LMX2330) in which the filter time constants are reduced at the beginning of the transient frequency settling or pull-in process of the PLL, in that a second resistor is temporarily connected parallel to a first resistor. In the final condition, the parallel resistor is again clamped off, so that the PLL once again operates with the normal small bandwidth.

SUMMARY OF THE INVENTION

In view of the above, it is an object of the invention to provide a circuit arrangement and method of the above mentioned general type, in which the transient frequency settling time or pull-in time of a phase locked loop is reduced while also sufficiently suppressing spurious signals, with a simple and economical circuit arrangement and method steps. Especially, the circuit arrangement and the method according to the invention shall not need complicated and costly adding circuits between the loop filter and the voltage controlled oscillator. The invention further aims to avoid or overcome the disadvantages of the prior art, and to achieve additional advantages, as apparent from the present specification. The attainment of these objects is, however, not a required limitation of the claimed invention.

The above objects have been achieved according to the invention in both a circuit arrangement and a method using such a circuit arrangement for generating frequencies with a phase regulating circuit and especially a phase locked loop, comprising (or cooperating with) a reference frequency generator or source, first and second frequency dividers, a phase/frequency detector, a charge pump, a loop filter, and an oscillator controlled by the output of the loop filter, wherein a divider ratio of the first and/or second frequency divider is controllably changeable (e.g. switchable among plural selectable divider ratios). Further and particularly according to the invention, the circuit arrangement additionally comprises a regulating signal generator, which, in connection with a change of the divider ratio of the first and/or second frequency divider, changes the control voltage of the voltage controlled oscillator in that it changes the output voltage of the loop filter in a controlled manner.

Because the regulating signal generator is used directly for generating a nominal or desired voltage for the output signal of the loop filter, it is possible according to the invention to omit or avoid a coupling of additional or auxiliary signals between the loop filter and the VCO. Therefore it especially not necessary to provide an adder circuit as in the prior art discussed above.

It is preferred according to the invention that the change of the output voltage of the loop filter is controlled in such a manner that the final value of the output voltage approximately corresponds to the value that arises after the circuit has fully settled to a new frequency caused by the change of the divider ratio. Through this feature, the VCO frequency is pushed or shifted into the region of the expected final value in a controlled manner in connection with the controlled switching of the divider ratio. If the remaining frequency error that still exists thereafter is sufficiently small, then the phase locked loop can pull-in and settle to the true final value in a relatively short time. In other words, the settling process is accelerated or given a "jump start" in a positively enforced manner. Thereby it is achieved, that even with an integer PLL circuit, a large frequency jump can be carried out in a time that is compatible with the GPRS requirements.

It is further preferred according to the invention, that the first frequency divider and the second frequency divider are controlled for a frequency change by the same common control signal that is also provided to the regulating signal generator. Furthermore, the regulating signal generator is designed and embodied so that it provides a predetermined output signal in response to and dependent on the received control signal. Through this common controlled switching of both frequency dividers and the regulating signal generator, a synchronization is achieved, which reduces interference in the following comparison of the output signals of the two frequency dividers in the phase/frequency detector. Through the above described design or embodiment of the regulating signal generator, the VCO can be provided with an immediately effective (i.e. without delay) base value synchronously with the controlled switching of the frequency divider or dividers. This reduces a frequency deviation in the phase/frequency detector.

Another preferred embodiment feature of the invention is that the regulating signal generator changes or varies the output voltage of the loop filter by tapping into or influencing the charge pump. Through this feature of the invention, the charge pump, which is present in the circuit anyway, is used to achieve a rapid controlled adaptation of the loop filter to the new required voltage output after a frequency change. Thereby, the capacitors present in the loop filter are recharged to the required new charge state directly by the charge pump. The regulating signal generator can be limited to providing or outputting a control voltage that controls the charge pump, i.e. the regulating signal generator itself does not need to provide the charging current, so that the current consumption of the regulating signal generator can be reduced. Thereby, it is not necessary for the regulating signal generator to be designed for high output currents, which further simplifies the circuit construction.

A further preferred embodiment of the circuit arrangement is characterized by including a comparator that compares the output signal of the regulating signal generator with a signal representing a charge state of the loop filter. This comparator then further controls the charge pump in connection with the controlled switching of the divider ratio. This embodiment represents a simple circuit-technical realization of a need-dependent control of the charge pump by the regulating signal generator. Thereby, an erroneous or improper control is avoided through the consideration of the charge state of the loop filter.

Another preferred feature of the invention is that the predetermined output signal of the regulating signal generator is selectively applied to (or interrupted from) an input of the loop filter through a controllable first interrupter switch. This embodiment represents a simple circuit means by which the loop filter can be selectively influenced by the regulating signal generator.

It is also preferred that the output signal of the regulating signal generator is selectively applied to (or interrupted from) an output of the charge pump via a controllable second interrupter switch, in addition to, or as an alternative to, the selective application of the regulating signal generator's output through the first interrupter switch. Thereby it is achieved, if applicable, that plural capacitors present in the loop filter are all brought to the nominal or desired base charge condition in parallel with each other. After such an initialization phase, it is then only necessary to additionally provide a relatively small corrective charging for the loop filter by means of the charge pump.

Preferably further, the first interrupter switch and/or the second interrupter switch is or are controlled by a timing generator dependent on the abovementioned common control signal. It is also preferred that the timing generator is supplementally controlled by an output signal of the first frequency divider. The time duration in which the regulating signal generator acts on the loop filter can be controlled by the timing generator. The above mentioned control through the output signal of the first frequency divider makes it possible to achieve a control of the time duration in whole number or integer multiples of the PLL comparison periods.

In another preferred embodiment of the invention, the regulating signal generator comprises a memory in which there are stored various different output signal values and/or output signal characteristic curves and/or various different output signal functions respectively for various different types of voltage controlled oscillators. Thereby, the one same PLL circuit can be used and laid out for various different types of VCOs and various different divider factors of the reference frequency divider. In this context, various different VCOs require respective different output signal values due to the different average or mid-frequencies and slopes of their signal characteristics.

In another preferred embodiment, the circuit arrangement includes an interrupter or interrupter switch, which opens the phase locked loop during the controlled switching of the divider ratio until the regulating signal generator has changed the output value of the loop filter in a controlled manner. It is also preferred that the charge pump supplies a reduced current to the loop filter during the application of the output signal of the regulating signal generator through the first and/or second interrupter switch. In this context, the reduced level of the current can be zero, i.e. "reduced current" can mean entirely interrupting or switching off the current. Thereby it is ensured that the phase locked loop and especially the charge pump will cause no interference or only a minimal interference during the initialization phase carried out by the regulating signal generator.

It is further preferred according to the invention, that the cycles of the frequency dividers of the circuit are synchronized after the change of the output signal of the loop filter caused by the regulating signal generator. This serves to avoid the occurrence of a large phase difference between the input signals of the phase/frequency detector in connection with a settled oscillating phase locked loop. Otherwise, such a phase difference could arise because the above described measures influence only the frequency of the VCO. However, in a closed or locked PLL, the two divided signals must correspond not only in the frequency but also in the phase thereof. Otherwise, the phase locked loop would attempt to compensate or even-out any existing phase difference. This would, however, lead to an undesired frequency change, because the phase difference is given by the time integral of the frequency difference.

It should be understood that the various features of the invention disclosed herein are not limited to be used only in the respective disclosed combination or combinations, but rather can also be provided in other combinations or even individually within the scope of the present invention.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF PREFERRED EXAMPLE EMBODIMENTS AND OF THE BEST MODE OF THE INVENTION

Figure 1:
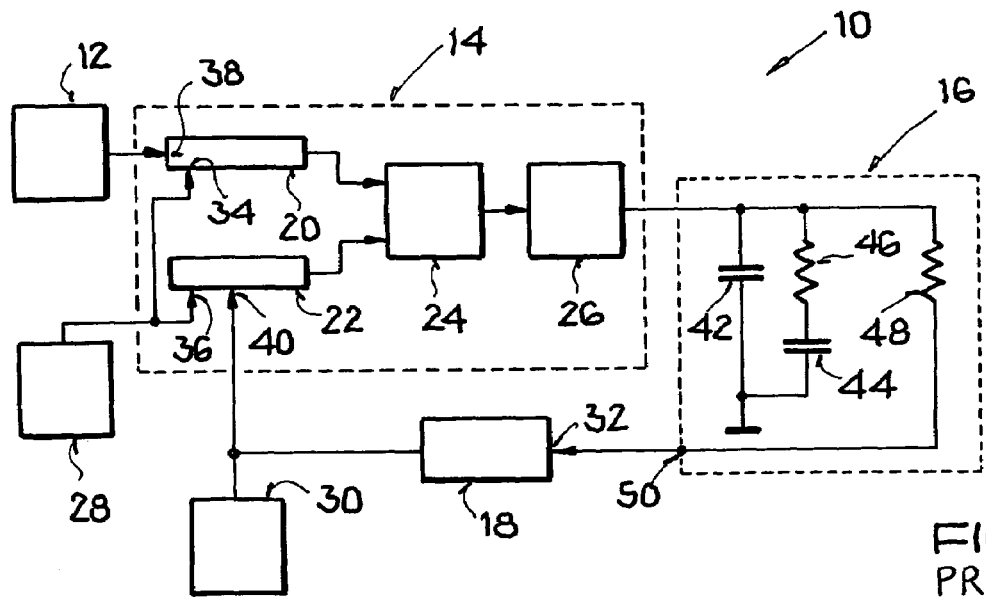
FIG. 1 is a schematic block circuit diagram of a conventional circuit arrangement of an integer phase locked loop (PLL)

To provide a background understanding of the basic starting point of the present invention, FIG. 1 schematically shows a conventional circuit arrangement 10 for generating frequencies with a reference frequency generator or source 12, a phase locked loop (PLL) circuit 14, a loop filter 16, and a voltage controlled oscillator (VCO) 18. The PLL circuit 14 comprises a first frequency divider 20, a second frequency divider 22, a phase/frequency detector 24 and a charge pump 26. The PLL circuit 14 is controlled by a controller, and particularly an external controller 28. In the example according to FIG. 1, the output frequency generated by the VCO 18 is provided to a frequency synthesizer 30 of a transceiver, which is not shown further in FIG. 1.

For explaining the functioning or manner of operation of the conventional circuit arrangement 10 according to FIG. 1, this example is based on the assumption that the frequency synthesizer 30 of the transceiver requires a signal with a frequency of 1968.8 MHz (i.e. 1.9688 GHz). The VCO 18, which is initially freely oscillating, is able to provide a frequency in a range or order of magnitude of 2 GHz. In that context, the frequency provided by the VCO 18 is controllable by applying a suitable DC voltage to a control input 32 of the VCO 18. By means of the circuit arrangement 10, the control voltage applied to the control input 32 of the VCO 18 is adjusted in such a manner, i.e. to such a value, so that the desired frequency of 1968.8 MHz arises or is established at the output of the VCO 18.

For this purpose, a reference frequency generated by the reference frequency generator or source 12 is applied to an input 38 of the first frequency divider 20. For example, the reference frequency generator 12 can be embodied as a quartz oscillator that generates a reference frequency of 13 MHz. The first frequency divider 20 divides the reference frequency by a divisor R that is provided or selected by the controller 28 via the control input 34 of the first frequency divider 20. In the further operation of the circuit arrangement, the divisor R is typically maintained constant. For example, the divisor R can correspond to a value of 65. Based on such a divisor value, the first frequency divider 20 reduces or divides down the reference frequency from 13 MHz to an output frequency value of 200 kHz. For a constant divisor R, this measure or value of 200 kHz also corresponds to the step width or increment at which the frequency of the VCO 18 can be varied or adjusted.

The output frequency of the VCO 18 is first provided to an input 40 of the second frequency divider 22, which divides the VCO output frequency by a natural number N that corresponds to the quotient of the nominal desired frequency and the step width or adjustment increment. In the presently described example, the divisor N for the second frequency divider 22 is given by the number N=(1968.8 MHz÷200 kHz)=9844, which is set by the controller 28 through the control input 36 of the second frequency divider 22. The results or outputs of the two frequency divisions in the first frequency divider 20 and the second frequency divider 22 are provided to respective inputs of the phase/frequency detector 24. The phase/frequency detector 24 produces an output signal always only when the frequencies and/or phase positions of the two input signals thereof differ from one another. Depending on whether the flanks of the divided VCO signal through the second frequency divider 22 or the flanks of the divided reference signal through the first frequency divider 20 are leading of lagging the respective other signal flanks, the phase/frequency detector 24 will generate corresponding different control signals for the charge pump 26 connected to the output of the detector 24, so that the circuit will regulate-out the detected frequency and/or phase differences.

The output signal of the charge pump 26 is provided to an input of the loop filter 16, which in general has a low pass filter characteristic, and produces at its output 50 the control signal for the control input 32 of the VCO 18. For this purpose, the loop filter 16 may, for example, comprise a network as illustrated, including a first capacitor 42 in parallel with a series connection of a first resistor 46 and a second capacitor 44 between the input of the loop filter 16 and a reference potential such as ground, as well as a second resistor 48 connected between the input and the output 50 of the loop filter 16.

With the above circuit arrangement and the above described operation, if the frequency at the output of the second frequency divider 22 is higher than the frequency at the output of the first frequency divider 20, the circuit arrangement 10 will generate a control voltage for the VCO 18, which causes a reduction of the output frequency of the VCO 18 and therewith a reduction of the output frequency of the second frequency divider 22, so as to tend toward and match the frequency at the output of the first frequency divider 20. In the opposite manner, if the frequency of the output signal of the second frequency divider 22 is smaller than the divided reference frequency output by the first frequency divider 20, then the circuit arrangement 10 will cause an increase of the VCO output frequency. Through this basic arrangement and operation, the desired output frequency of the VCO 18, which corresponds to a frequency of 1968.8 MHz in the presently explained example, can be adjusted and established with an accuracy of a few kHz.

A change of the output frequency of the VCO 18 in the example circuit arrangement 10 according to FIG. 1 is achieved through a change of the divisor N provided by the controller 28 to the control input 36 of the second frequency divider 22. A certain amount of time is required for the exemplary circuit arrangement 10 of FIG. 1 to adjust the frequency through a transient period and then pull-in or settle on the new required frequency. When the required frequency change of the output frequency of the VCO 18 involves a large frequency jump, for example a frequency jump over 150 MHz, the so-called settling time in the case of a conventional circuit arrangement 10 is greater than the settling time of 150 µs to 200 µs required in GPRS standard applications.

Figure 2:
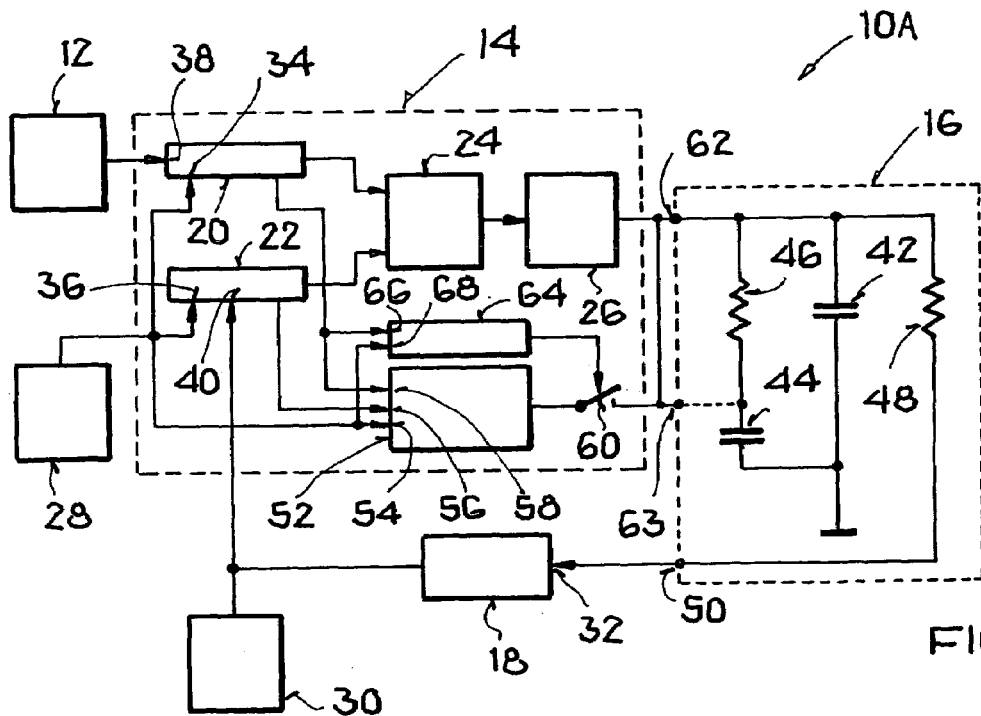
FIG. 2 is a schematic block circuit diagram of a first example embodiment of a circuit according to the invention.

Building on the basic circuit arrangement 10 of FIG. 1, FIG. 2 shows a first example embodiment of an inventive circuit arrangement 10A that can achieve a reduced settling time in comparison to the circuit arrangement 10 of FIG. 1, when switching to a new frequency, especially with a frequency jump over 150 MHz. Particularly, the inventive circuit arrangement 10A is able to achieve a settling time within the required maximum time of 150 µs to 200 µs.

The inventive circuit arrangement 1OA of FIG. 2 includes the same or similar components of the circuit arrangement 10 of FIG. 1 as described above, whereby the same or similar elements are referenced with the same reference numbers, and will not be redundantly described here. Furthermore, to achieve the reduced settling time, the inventive circuit arrangement 10A according to FIG. 2 additionally comprises a regulating signal generator 52, which changes the output voltage of the loop filter 16 in a controlled manner in connection with a frequency change or jump of the circuit arrangement. The regulating signal generator 52 can be embodied as a voltage source or as a current source, for example as a characteristic curve controlled digitaltoanalog converter, which receives via its first input 54 a control signal from the controller 28. This control signal also controls the first frequency divider 20 and the second frequency divider 22. In this manner, the regulating signal generator 52 is notified whenever the controller 28 effectuates a frequency change by changing the divisor N, as described above.

Furthermore, the divisor N is provided from an output of the second frequency divider 22 to the regulating signal generator 52 via its second input 56. Analogously, the divisor R is provided from an output of the first frequency divider 20 to the regulating signal generator 52 via its third input 58. Since the divisors N and R define the new frequency desired by the controller 28, the regulating signal generator 52 can thus, for example, address an appropriate characteristic curve or function stored in the generator 52, which will produce an expected value for the control signal to be provided from the loop filter 16 to the control input 32 of the VCO 18 for the new selected target frequency that is to be established.

Particularly, the expected value is established at the output 50 of the loop filter 16 as a result of the regulating signal output applied by the regulating signal generator 52 via a first interrupter switch 60 to at least a first input 62 of the loop filter 16. In the exemplary loop filter 16 illustrated in FIG. 2, the time constant thereof is dominated by the first resistor 46 and the second capacitor 44 connected in series between the first input 62 of the loop filter 16 and the reference potential such as ground. Thus, the transient settling time of the phase locked loop will be determined by the speed at which the relatively large capacitance (typically 10 nF to 30 nF) of the second capacitor 44 is recharged to the new required charge state.

The transient settling or frequency pull-in of the phase locked loop after a frequency change triggered by the controller 28 can be improved, i.e. accelerated, in the circuit arrangement 10A according to FIG. 2, if the second capacitor 44 of the loop filter 16 can be charged essentially directly or immediately at the beginning of the transient settling process to a new desired charge value that at least approximately corresponds to the expected final charge value for the new selected frequency. This charging of the second capacitor 44 can be achieved within a relatively short time of about 5 µs to 15 µs by appropriate dimensioning and design of the regulating signal generator 52.

After this initial charging time, the phase locked loop will further oscillate with its normal time constant to the final settled state or condition at the new selected frequency. A shorter total transient settling time is achieved in the circuit arrangement 10A according to FIG. 2, because after the controlled recharging of the second capacitor 44, the resulting VCO frequency already lies in a relatively small or close range of the final value of the new selected target frequency. If the remaining frequency error is sufficiently small, then the phase locked loop will oscillate to the final value in a relatively short time. In this manner, even using an integer PLL, a large frequency jump on the order of 150 MHz can be carried out in a time span, i.e. a settling time range, that is compatible with requirements, for example in connection with GPRS applications.

The first interrupter switch 60 is controlled by a timing generator 64 in such a manner so that the first interrupter switch 60 is generally open in the normal state, but is then closed for a predetermined time in order to achieve the rapid transient settling to a new selected target frequency. For example, the predetermined time may relate to a predetermined number of periods of the divided reference signal produced by the first frequency divider 20 and provided to the timing generator 64 via an input 66. The closing of the interrupter switch 60 is triggered by a control command provided to a second input 68 of the timing generator 64 from a corresponding control output of the controller 28.

For the adjustment of the new selected target frequency by means of the controlled changing of the output voltage of the loop filter 16, it is desired to achieve an accuracy that corresponds approximately to a width of 5% to 10% of the total range of the frequency bandwidth covered by the output of the VCO 18. For example, for a VCO 18 with a slope of about 100 MHz/V and a total target range of about 2 V, the target frequency should be attained substantially exactly to about 10 to 20 MHz. For the case that the required frequency jump to the new selected target frequency is smaller than this range of inaccuracy, the activation of the regulating signal generator 52 can be suppressed or omitted. This requirement defines the accuracy of the regulating signal generator 52. In a realization or embodiment of the generator 52 as a digital/analog converter, a resolution of about 6 to 10 bits should be taken as the basic starting point.

If the PLL circuit 14 is to be designed or laid out to be used for various different types of VCOs 18 and various different divider factors R of the reference frequency divider 20, the regulating signal generator 52 must additionally contain stored values which define the necessary output voltage of the generator 52 for the average or mid-frequency of each respective VCO 18, and with which the resolution of the generator 52 is adapted to the slope of each respective VCO 18.

Since the nominal desired value of the control voltage at the control input 32 of the VCO 18 is produced by the regulating signal generator 52 through the loop filter 16, this control voltage can also be applied to the output of the charge pump 26 via a second interrupter switch 70. This can be carried out either alternatively or in addition to the application of the output signal of the regulating signal generator 52 via the first interrupter switch 60 to the loop filter 16. In the circuit arrangement 10A of FIG. 2, the loop filter 16 may further include an optional second input 63, to which the alternative or additional application of the output signal of the generator 52 is possible. Nonetheless, a control via only the first input 62 of the loop filter 16 has the advantage, that the extra terminal or connection pin for the optional second input 63 is not necessary and can thus be saved, thereby simplifying and economizing the circuit. This is analogously also true for the circuit arrangements 10B and 10C according to FIGS. 3 and 4.

Figure 3:
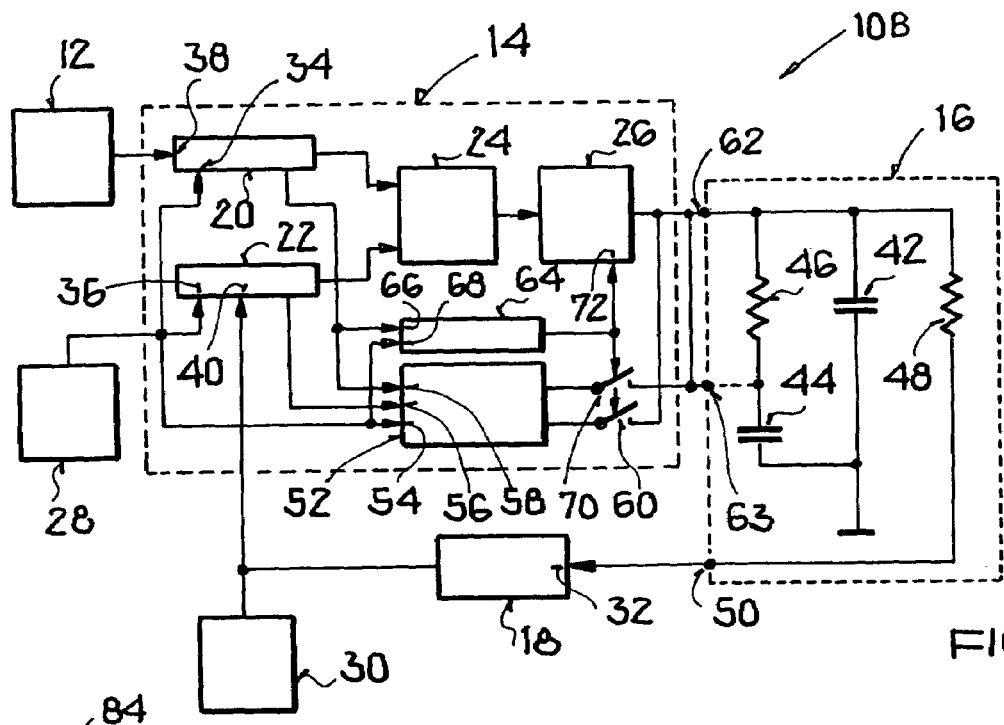
FIG. 3 is a schematic block circuit diagram of a second example embodiment of a circuit according to the invention.

Through the application of the output signal of the regulating signal generator 52 to the output of the charge pump 26, in the embodiment of the loop filter 16 in the second embodiment of the inventive circuit arrangement 10B according to FIG. 3, it is achieved that both capacitors 42 and 44 of the loop filter 16 will be charged in parallel to the new desired value. After this initial charging or initialization phase with closed interrupter switches 60 and 70, the charge pump 26 only needs to further provide a relatively small corrective charge to the loop filter 16 to achieve the required end value charge state.

FIG. 3 schematically shows further alternatives for changing or varying the output voltage of the loop filter 16 by means of the regulating signal generator 52. The second interrupter switch 70 is controlled together with the first interrupter switch 60 by the timing generator 64. In this regard, the control is carried out in the same manner as has been described above in connection with FIG. 2. The control signal from the timing generator 64 for the two interrupter switches or interrupters 60 and 70 can additionally be applied to a control input 72 of the charge pump 26, in order to switch off the charge pump 26 during the initialization phase with closed interrupter switches 60 and 70, or at least to reduce the current provided by the charge pump during this phase. In this manner it is ensured that the charge pump 26 will not cause unacceptable interference during the initialization phase. Upon switching on the charge pump 26 once the interrupter switches 60 and 70 are again opened, care must be taken however, that the preceding initialization phase was at least long enough so that at least one comparison sequence has been carried out in the phase/frequency detector 24 with the new set frequency that has been positively enforced by the regulating signal generator 52 and the new divider factor N (and if applicable also R).

Figure 4:
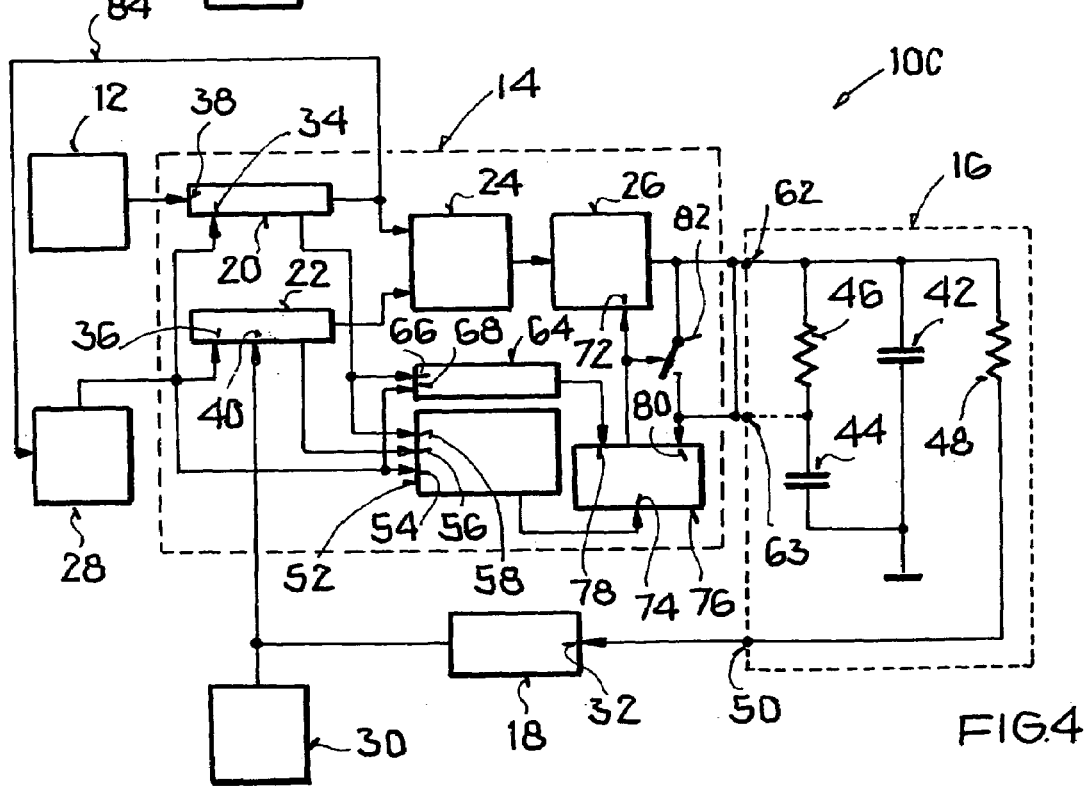
FIG. 4 is a schematic block circuit diagram of a third example embodiment of a circuit according to the invention.

An alternative embodiment involves connecting the charge pump 26 in such a manner so that the current for charging the capacitors 42 and 44 is supplied directly by the charge pump 26. Thereby, there is no need for the regulating signal generator 52 to be designed to handle high output currents. A circuit arrangement 10C for this alternative embodiment is shown in FIG. 4. Particularly, the circuit arrangement 10C in FIG. 4 further comprises a comparator 76, which receives the output signal of the regulating signal generator 52 through a first input 74. Furthermore, through a second input 78, the comparator 76 is controlled by the timing generator 64. Still further, via a third input 80, the comparator 76 receives a signal representative of the charge state of the loop filter 16. This signal may, for example, be the potential or voltage level at a point between the resistor 46 and the second capacitor 44 in the loop filter 16.

An interrupter switch 82 is open in the normal state in which the charge pump 26 is controlled by the phase/frequency detector 24. If then a new selected target frequency is to be set, then the timing generator 64 triggers a comparison of the signal regarding the charge state of the loop filter 16 with the desired value produced by the regulating signal generator 52 and applied to the comparator 76 via the first input 74. Moreover, the comparator 76 takes over the control of the charge pump 26. If the charge state of the loop filter 16 does not correspond to the desired value, then the comparator 76 closes the interrupter switch 82 and controls the charge pump 26 via its control input 72 in such a manner so that the charge state of the loop filter 16 is charged to and reaches the desired value. When this is the case, the interrupter switch 82 is opened and the phase/frequency detector 24 once again takes over the control of the charge pump 26.

The above described measures influence exclusively the frequency of the VCO 18. However, in a closed or locked phase regulating circuit, e.g. phase locked loop, the two divided signals must correspond not only in the frequency but also in the phase thereof. Thus, this can lead to the result that the two input signals of the phase/frequency detector 24 correspond to one another in their frequency at the end of the initialization phase, yet exhibit a large phase difference. The regulating loop of the phase regulating circuit then attempts to compensate or regulate out this phase difference, which necessarily leads to a frequency change.

In order to keep this effect small, it is advantageous to synchronize the cycles of the two frequency dividers 20 and 22 respectively for the reference frequency and the VCO frequency. This can be achieved in that the first frequency divider 20, which normally operates with a fixed dividing ratio R, serves as a clock signal or timing pulse generator for the initialization phase. The time point at which the operation switches from the initialization phase back to the normal operation is preferably fixed as a defined multiple of the period of the output signal of the first frequency divider 20.

If then the second frequency divider 22 for the VCO frequency is switched off during the initialization phase, it can be switched back on again synchronously with the first frequency divider 20 in connection with the switching of the phase locked loop back into the normal operating mode. For this purpose, the circuit arrangement 10C further includes a control connection 84 by which the output signal of the first frequency divider 20 is additionally provided back to the controller 28. Thereby, the controller 28 can activate the second frequency divider 22 via its control input 36 after the completion of a defined number of periods of the divided reference signal.

If the frequency of the VCO 18 sufficiently accurately corresponds with the nominal desired frequency, then merely a small phase difference will arise at the inputs of the phase/frequency detector 24 due to the initial synchronous control of the two frequency dividers 20 and 22. Thereby, the above mentioned readjusting of the phase regulating circuit or phase locked loop is reduced. In sum, this achieves a further reduction of the transient settling time of the phase locked loop after a frequency jump to a new selected frequency.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A circuit arrangement for generating selected frequencies, comprising:
   a first frequency divider having a reference frequency input adapted to have a reference frequency applied thereto, and a first divider output;
   a loop filter having a loop filter output, and a loop filter input set including at least one loop filter input:
   an oscillator having an oscillator control input connected to said loop filter output, and an oscillator output;
   a second frequency divider having a signal input connected to said oscillator output, and a second divider output;
   a phase/frequency detector having first and second detector inputs respectively connected to said first and second divider outputs, and a detector output;
   a charge pump having a charge pump input connected to said detector output and a charge pump output connected to at least one loop filter input selected from said loop filter input set; and
   a regulating signal generator that has at least one input connected respectively to at least one of said first and second frequency dividers, and a regulating signal output connected at least intermittently to said charge pump and/or at least one loop filter input selected from said loop filter input set;
   wherein at least one of said first and second frequency dividers is a respective controllable first or second frequency divider that is adapted to divide a frequency of an input signal received at said respective input thereof by a respective controllable variable divider ratio to produce at said divider output thereof a resulting divider output signal having a divided frequency; and
   wherein, via said at least one input of said regulating signal generator, said regulating signal generator is adapted to receive information regarding said controllable variable divider ratio, and said regulating signal generator is adapted to produce at said regulating signal output a regulating signal responsive to and dependent on said information regarding said controllable variable divider ratio, and said regulating signal generator is adapted to vary said regulating signal in response to a change of said controllable variable divider ratio so that an output voltage produced at said loop filter output and provided to said oscillator control input is varied in a controlled manner.

2. The circuit arrangement according to claim 1, wherein said output voltage is varied in said controlled manner such that said output voltage is changed to within +/−10% from a final voltage value that will be established after a transient oscillation settles to a new selected frequency in response to a change of said controllable variable divider ratio.

3. The circuit arrangement according to claim 1, wherein said second frequency divider is said controllable second frequency divider and has a divider ratio output, and wherein said at least one input of said regulating signal generator comprises a divider ratio input connected to said divider ratio output.

4. The circuit arrangement according to claim 1, wherein said second frequency divider is said controllable second frequency divider and has a divider control Input, and wherein said at least one input of said regulating signal generator comprises a regulation control input connected to said divider control input so that said divider control input and said regulation control input both are adapted to receive an externally supplied common control signal triggering said change of said controllable variable divider ratio.

5. The circuit arrangement according to claim 1, wherein said first and second frequency dividers are both said controllable first and second frequency dividers and respectively have first and second divider ratio outputs, and wherein said at least one input of said regulating signal generator comprises first and second divider ratio inputs connected respectively to said first and second divider ratio outputs.

6. The circuit arrangement according to claim 1, wherein said first and second frequency dividers are both said controllable first and second frequency dividers and respectively have first and second divider control inputs, wherein said at least one input of said regulating signal generator comprises a regulation control input that is connected in common to said first and second divider control inputs so that said first and second divider control inputs and said regulation control input are all adapted to receive in common an externally supplied common control signal triggering said change respectively of said respective controllable variable divider ratios, and wherein said regulating signal generator is adapted to produce at said regulating signal output said regulating signal that is predefined and responsive to said common control signal which comprises said information regarding said controllable variable divider ratio.

7. The circuit arrangement according to claim 1, wherein said regulating signal output of said regulating signal generator is connected at least indirectly to a control input of said charge pump, so as to control a charging output at said charge pump output and thereby vary said output voltage at said loop filter output.

8. The circuit arrangement according to claim 7, further comprising a comparator interposed between said regulating signal output of said regulating signal a generator and said control input of said charge pump, wherein said comparator has a first comparator input connected to said regulating signal output, a second comparator input connected to a terminal of said loop filter and adapted to receive a charge signal indicative of a charge state of said loop filter, and a comparator output connected to said control input of said charge pump, and wherein said comparator is adapted to compare said regulating signal with said charge signal and to produce a comparator output signal at said comparator output adapted to control said charge pump responsive to a change of said controllable variable divider ratio.

9. The circuit arrangement according to claim 8, further-comprising a controllable switch that is interposed between said charge pump output and said terminal of said loop filter and that has a switch control input connected to said comparator output.

10. The circuit arrangement according to claim 1, wherein said regulating signal output of said regulating signal generator is connected at least intermittently to a first loop filter input selected from said loop filter input set.

11. The circuit arrangement according to claim 10, wherein said regulating signal output of said regulating signal generator is further connected at least intermittently to a second loop filter input selected from said loop filter input set, wherein said second loop filter input and said first loop filter input are respectively connected to a different points of a loop filter circuit of said loop filter.

12. The circuit arrangement according to claim 10, further comprising a first interrupter switch interposed between said regulating signal output and said first loop filter input to which said regulating signal output is directly connected at least intermittently through said first interrupter switch.

13. The circuit arrangement according to claim 12, further comprising a second interrupter switch interposed between said regulating signal output and said charge pump output.

14. The circuit arrangement according to claim 1, further comprising an interrupter switch interposed between said regulating signal output and said charge pump output.

15. The circuit arrangement according to claim 1, further comprising an interrupter switch connected to said regulating signal output to selectively interrupt said regulating signal, and a timing generator that has a timing signal output connected to a control input of said interrupter switch.

16. The circuit arrangement according to claim 15, wherein said timing generator, said first and second frequency dividers and said regulating signal generator respectively further have respective control inputs that are connected in common to each other and adapted to receive an externally supplied common control signal triggering said change respectively of said respective controllable variable divider ratio.

17. The circuit arrangement according to claim 16, wherein said first frequency divider has a divider information output, and said timing generator further has a timing control input connected to said divider information output.

18. The circuit arrangement according to claim 1, wherein said regulating signal generator comprises a memory having stored therein data elements selected from the group consisting of various different output signal values, various different output signal characteristic curves, or various different output signal characteristic functions respectively for various different types of voltage controlled oscillators that may be selected and provided as said oscillator.

19. The circuit arrangement according to claim 18, wherein said regulating signal generator comprises a digitaltoanalog converter controlled by said data elements.

20. The circuit arrangement according to claim 1, wherein said regulating signal generator comprises a voltage source.

21. The circuit arrangement according to claim 1, wherein said regulating signal generator comprises a current source.

22. The circuit arrangement according to claim 1, omitting and excluding an adding circuit connected between said loop filter and said oscillator.

23. The circuit arrangement according to claim 1, further comprising at least one interrupter switch connected between said regulating signal output and said charge pump and adapted to selectively interrupt said regulating signal, wherein said charge pump is adapted and controlled to provide a charging current via said charge pump output to said loop filter while said at least one interrupter switch is closed.

24. A circuit arrangement for generating frequencies with a phase locked loop that comprises a reference frequency generator, a first frequency divider, a phase/frequency detector, a charge pump, a loop filter having a loop filter input set including at least one loop filter input, an oscillator controlled by the loop filter, and a second frequency divider, wherein a divider ratio of the first frequency divider and/or of the second frequency divider is controlledly changeable, and further comprising a regulating signal generator that is adapted to produce a regulating signal and to change the regulating signal in response to a change of the divider ratio so that the regulating signal generator thereby is adapted to change in a controlled manner an output voltage of the loop filter provided as a control voltage to the oscillator.

25. A method of generating selectable frequencies with a phase locked loop, comprising the steps:
a) generating an oscillator frequency with a voltage controlled oscillator;
b) dividing a reference frequency by a first divider factor to produce a divided reference frequency;
c) dividing said oscillator frequency by a second divider a factor to produce a divided oscillator frequency;
d) detecting any existing phase and/or frequency difference between said divided reference frequency and said divided oscillator frequency;
e) in response to and dependent on a result of said detecting, charging a loop filter that has an output and a loop filter input set including at least one loop filter input, to produce a control voltage at said output of said loop filter;
f) applying said control voltage to said oscillator to control said oscillator frequency in response to and dependent on said control voltage;
g) changing a respective value of at least one of said first and second divider factors and then repeating or continuing said steps a) to f) in order to trigger a change of a value of said oscillator frequency from a prior frequency value to a new frequency value;
h) generating a regulating signal in response to and dependent on said changing of said respective value of said at least one of said first and second divider factors; and
i) changing said control voltage produced by said loop filter in a controlled manner in response to and dependent on said regulating signal.

26. The method according to claim 25, wherein said step i) comprises applying said regulating signal to at least one of said charge pump and said loop filter.

27. The method according to claim 25, wherein said regulating signal accelerates a recharging of said loop filter from a prior charge state to a new charge state to establish a new value of said control voltage that brings about said change of said value of said oscillator frequency from said prior frequency value to said new frequency value.

28. The method according to claim 25, wherein said step i) comprises changing said control voltage in said controlled manner to a changed voltage value that is moved closer to a final control voltage value that will be established to achieve said new frequency value after a transient settling time.

29. The method according to claim 25, further comprising comparing said regulating signal with a charge signal that is indicative of a charge state of said loop filter, and controlling said charge pump in response to and dependent on a result of said comparing in connection with said changing in said step g).

30. The method according to claim 25, further comprising selectively interrupting said regulating signal under control of a timing generator in response to and dependent on a control signal that controls said changing in said step g).

31. The method according to claim 30, further comprising controlling said generating in said step h) in response to and dependent on said control signal.

32. The method according to claim 30, wherein said timing generator is further controlled in response to and dependent on said dividing of said reference frequency by said first divider factor in said step b).

33. The method according to claim 25, further comprising temporarily interrupting or delaying at least one of said steps d) and e) until said steps h) and i) have been completed following said changing in said step g).

34. The method according to claim 25, further comprising synchronizing cycles of said dividing in said steps b) and c) after completion of said step i).

35. The method according to claim 25, wherein a frequency difference between said prior frequency value and said new frequency value is at least 150 MHz, and through said steps f) to i) said oscillator frequency changes from said prior frequency value and settles to said new frequency value in a time of no more than 200 ps.

36. The circuit arrangement according to claim 1, wherein exclusively said loop filter output is connected directly to said oscillator control input.

* * * * *

UNITED STATES PATENT AND TRADEMARK OFFICE
CERTIFICATE OF CORRECTION

PATENT NO. : 7,129,791 B2  Page 1 of 1
APPLICATION NO. : 10/912529
DATED : October 31, 2006
INVENTOR(S) : Hofmann It is certified that error appears in the above-identified patent and that said Letters Patent is hereby corrected as shown below:

Column 7,
Line 26, after "arrangement", replace "1OA" by --10A--;
Line 38, after "controlled", replace "digitaltoanalog" by --digital-to-analog--;

Column 11,
Line 13, after "filter input", replace ":" by --;--;
Line 67, after "control", replace "Input" by --input--;

Column 12,
Line 28, after "that is", replace "predefined" by --pre-defined--;
Line 40, after "regulating signal", delete --a--;
Line 52, after "further", delete "-";
Line 66, after "connected to", delete --a--;

Column 13,
Lines 38 and 39, after "a", replace "digitaltoanalog" by --digital-to-analog--;

Column 14,
Line 10, before "factor", delete --a--;

Column 16,
Line 3, after "200", replace "ps" by --µs--.

Signed and Sealed this

Twenty-sixth Day of June, 2007

JON W. DUDAS
*Director of the United States Patent and Trademark Office*